(12) United States Patent
Lee

(10) Patent No.: US 6,987,699 B2
(45) Date of Patent: Jan. 17, 2006

(54) CLOCK DRIVER IN SEMICONDUCTOR MEMORY DEVICE

(75) Inventor: Ihl-Ho Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 191 days.

(21) Appl. No.: 10/331,351

(22) Filed: Dec. 31, 2002

(65) Prior Publication Data

US 2003/0223279 A1 Dec. 4, 2003

(30) Foreign Application Priority Data

May 30, 2002 (KR) .................... 10-2002-0030187

(51) Int. Cl.
*G11C 7/00* (2006.01)
(52) U.S. Cl. .................... 365/194; 365/233; 327/158
(58) Field of Classification Search ................ 365/196, 365/194, 233; 327/158
See application file for complete search history.

(56) References Cited

U.S. PATENT DOCUMENTS

| | | | |
|---|---|---|---|
| 5,337,285 A | 8/1994 | Ware et al. | |
| 6,396,322 B1 * | 5/2002 | Kim et al. | 327/158 |
| 6,545,531 B1 * | 4/2003 | Hur | 327/544 |
| 6,570,813 B2 * | 5/2003 | Van De Graaff | 365/233 |
| 6,618,283 B2 * | 9/2003 | Lin | 365/141 |
| 6,678,206 B2 * | 1/2004 | Chu et al. | |
| 6,768,690 B2 * | 7/2004 | Kwon et al. | 365/194 |
| 6,822,924 B2 * | 11/2004 | Lee | 365/233 |
| 2002/0064083 A1 | 5/2002 | Ryu et al. | |
| 2002/0136082 A1 | 9/2002 | Chu et al. | |

* cited by examiner

*Primary Examiner*—Richard Elms
*Assistant Examiner*—Hien Nguyen
(74) *Attorney, Agent, or Firm*—Mayer, Brown, Rowe & Maw LLP

(57) ABSTRACT

A clock driver in a semiconductor memory device does not output a rising edge clock signal and a falling edge clock signal outputted from a DLL circuit when there are no data transmitted to a data output pin in a read operation. A clock driver which can reduce current consumption by suppressing output of a rising edge clock signal and a falling edge clock signal in a stand-by mode in a semiconductor memory device. The clock driver for use in a semiconductor memory device according to the present invention does not output a rising edge clock signal and a falling edge clock signal outputted from a DLL circuit when there is no data transmitted to a data output pin in a read operation.

8 Claims, 5 Drawing Sheets

CLOCK DRIVER IN SEMICONDUCTOR MEMORY DEVICE

FIELD OF THE INVENTION

The present invention relates to a semiconductor memory device; and, more particularly, to a circuit and a method for controlling a sense amplifier controller sensing a bit line in the semiconductor memory device.

DESCRIPTION OF RELATED ART

A double data rate dynamic random access memory (DDR DRAM) or a DDR II DRAM transmits data in synchronization with an external clock signal. It is essential to synchronize the data with the external clock signal in order to perform a highly speedy operation. Accordingly, a DLL circuit is embedded in a semiconductor memory device in order to accurately synchronize the data with the clock signal. The DLL circuit receives the external clock signal and generates an internal clock signal having a little faster phase than that of the external clock signal. The internal clock signal compensates a delay generated due to internal circuits, so that the data is outputted in synchronization with the external clock signal in a data output path in the semiconductor memory device. Since the DLL circuit is coupled to a lot of gates of transistors in the data output path and buffers, the DLL circuit has a high capacitance. Therefore, as the toggle of the output clock signal of the DLL circuit increases, a current consumption is increased in the DRAM.

A current aspect of the DRAM is classified with a power down mode and a non-power down mode according to a clock enable signal CKE. When the clock enable signal CKE becomes a high state, the DLL circuit of the DRAM becomes a stand-by mode, that is to say, the non power down mode, waiting to perform specific operations, e.g., read and write operations. When the clock enable signal CKE becomes a low state, the DLL circuit becomes the power down mode for reducing a current consumption.

Hereinafter, a DLL circuit operation for the stand-by mode will be described.

FIG. 1A is a block diagram illustrating a conventional clock driver and peripheral circuits thereof and FIG. 1B is a timing diagram showing operations of clock signals according to the prior art.

Referring to FIGS. 1A and 1B, a clock driver 200 receives a first rising edge clock signal CLK_R and a first falling edge clock signal CLK_F outputted from a DLL circuit 100 and outputs a second rising edge clock signal RCLK and a second falling edge clock signal FCLK to a data input/output control logic 300 in response to the clock enable signal CKE. Since the clock enable signal CKE becomes a low state in the power down mode, the second rising edge clock signal RCLK and the second falling edge clock signal outputted from the clock driver 200 become a low state. However, since the clock enable signal CKE becomes a high state in the stand-by mode that is the non power down mode, the second rising edge clock signal RCLK and the second falling edge clock signal FCLK are maintained identical to the first rising edge clock signal CLK_R and the first falling edge clock signal CLK_F outputted from the DLL circuit 100.

As shown in FIG. 1B, the second rising edge clock signal RCLk and the second falling edge clock signal FCLK outputted from the clock driver 200 are maintained in a low state without any variation during a period of which the clock enable signal CKE is a low state. On the other hand, the second rising edge clock signal RCLk and the second falling edge clock signal FCLK are varied in a period of which the clock enable signal CKE is a high state. Namely, it means that a current is consumed by performing charge and discharge operation of a plurality of parasite capacitors, which are made by a plurality of logics related with the second rising edge clock signal RCLK and the second falling edge clock signal FCLK outputted from the clock driver 200.

Since amount of current consumed in a stand-by mode is relatively lower than that of current consumed in read/write operations of the semiconductor memory device, a current consumed by triggering of the second rising edge clock signal RCLK and the second falling clock signal FCLK outputted from the clock driver 200 is relatively high for the stand-by current consumption.

Since the second rising edge clock signal RCLK and the second falling edge clock signal FCLK are used only for a data read operation, that is to say, the second rising edge clock signal RCLK and the second falling edge clock signal FCLK are unnecessary clock signals when the data read operation is not carried out, there is a problem that an necessary current consumption is generated when the data read operation is not carried out.

SUMMARY OF THE INVENTION

It is, therefore, an object of the present invention to provide a clock driver capable of reducing current consumption by suppressing output of a rising edge clock signal and a falling edge clock signal in a stand-by mode in a semiconductor memory device.

In accordance with an aspect of the present invention, there is provided a clock driver in a semiconductor memory device, which a rising edge clock signal and a falling edge clock signal are not outputted when there are no data transmitted to a data output pin in a read operation.

In accordance with another aspect of the present invention, there is provided a clock driver in a semiconductor memory device, comprising: a NAND gate receiving a row address strobe idle signal, which becomes a first logic state when all wordlines are in a precharge mode, and a data out off signal, which becomes a first logic state when there are no data transmitted to a data output pin in a read operation; a first AND gate receiving a rising edge clock signal outputted from a delay locked loop and a clock enable signal for enabling a clock signal; a first inverter for inverting an output signal of the first AND gate; a D flip/flop receiving output signals of the NAND gate and the first inverter; and a second AND gate receiving output signals of the first AND gate and the D flip/flop.

In accordance with further another aspect of the present invention, there is provided a clock driver in a semiconductor memory device, comprising: a NAND gate receiving a row address strobe idle signal, which becomes a first logic state when all wordlines are in a precharge mode, and a data out off signal, which becomes a first logic state when there are no data transmitted to a data output pin in a read operation; a first AND gate receiving a rising edge clock signal outputted from a delay locked loop and a clock enable signal for enabling a clock signal; and a second AND gate receiving output signals of the NAND gate and the first AND gate.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a clock driver in a semiconductor memory device according to the present invention will be described in detail referring to the accompanying drawings.

Figure 1A:
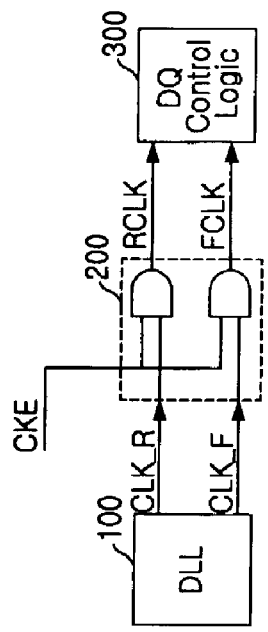
FIG. 1A is a block diagram illustrating a conventional clock driver and peripheral circuits.
Figure 1B:
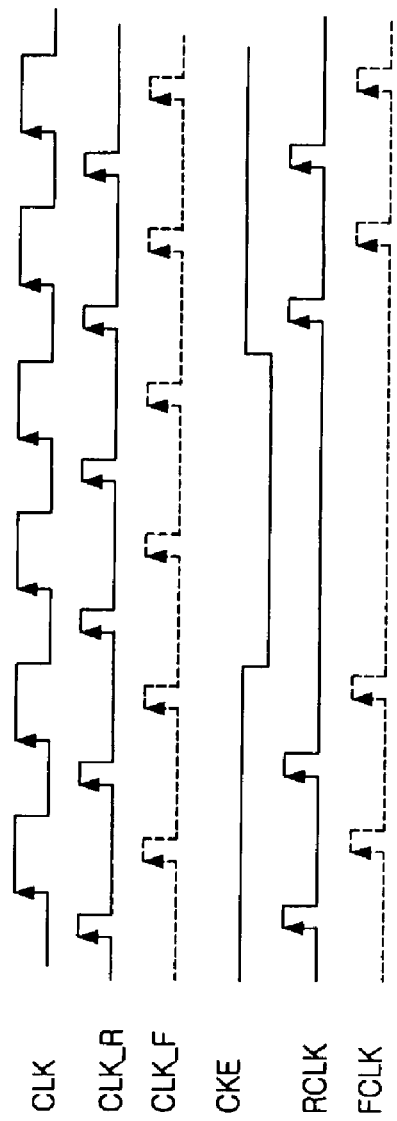
FIG. 1B is a timing diagram showing operations of clock signals according to the prior art.
Figure 2:
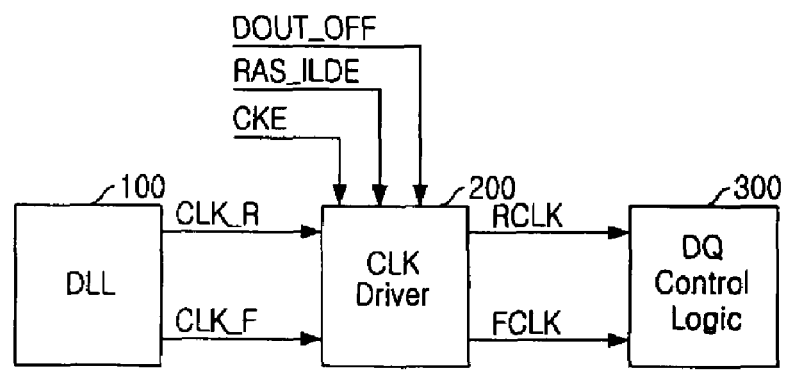
FIG. 2 is a block diagram illustrating a clock driver and peripheral circuits thereof in accordance with the present invention.

FIG. 2 is a block diagram illustrating a clock driver and peripheral circuits thereof in accordance with the present invention.

The clock driver 200 receives a rising edge clock signal CLK_R and a falling edge clock signal CLK_F applied from a DLL 100 and a clock enable signal CKE applied from an external circuit. The clock driver 200 additionally receives a row address strobe idle signal RAS_IDLE and a data out off signal DOUT_OFF in accordance with the present invention.

The row address strobe idle signal RAS_IDLE becomes a high stage when all wordlines are reset. That is to say, the row address strobe idle signal RAS_IDLE becomes a high state in a precharge state and, when at least one of wordlines is activated, the row address strobe idle signal RAS_IDLE is transited to a low state. And, the data out off signal DOUT_OFF becomes a high state when there are no data outputted to a data output pin in a read operation. Namely, the row address strobe idle signal RAS_IDLE is related with the wordline and the data out off signal DOUT_OFF is related with the data of the column line. Therefore, when the row address strobe idle signal RAS_IDLE and the data out off signal DOUT_OFF become a high state, a rising edge clock signal RCLK and a falling edge clock signal FCLK outputted from the clock driver 200 are not necessary in a non power down mode. The rising edge clock signal RCLK and the falling edge clock signal FCLK cannot be outputted from the clock driver 200 by using characteristics of the conventionally existing signals.

Figure 3:
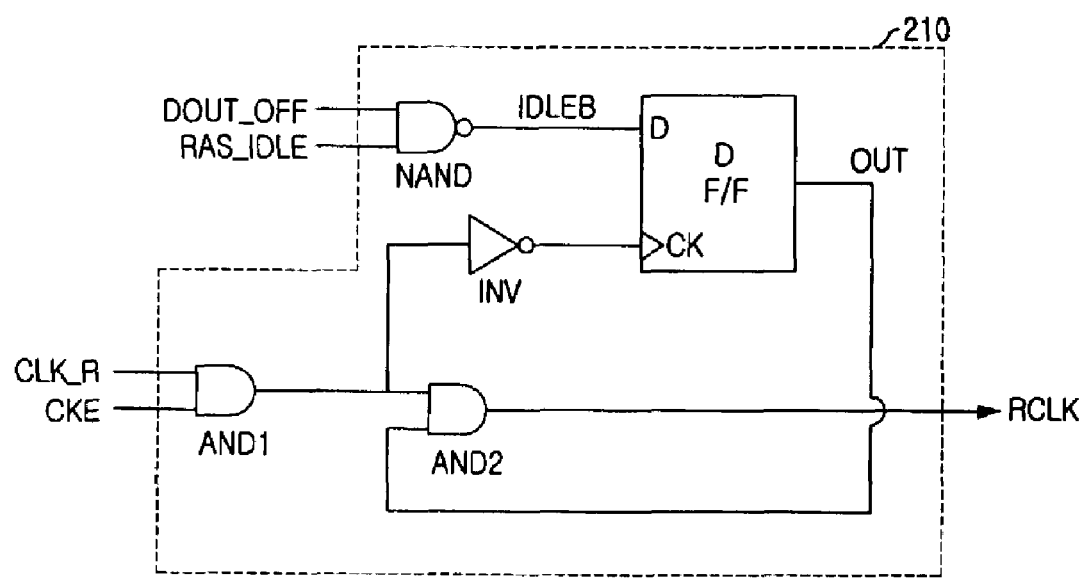
FIG. 3 is a circuit diagram illustrating a rising clock signal generation circuit in the clock driver.

FIG. 3 is a circuit diagram illustrating a rising clock signal generation circuit 210 in the clock driver 200 in accordance with the preferred embodiment of the present invention.

The rising clock signal generation circuit 210 includes a D flip/flop (F/F), an NAND gate NAND, a first AND gate AND1, a second AND gate AND2 and an inverter INV1. The row address strobe idle signal RAS_IDLE and the data out off signal DOUT_OFF are logically combined in the NAND gate NAND1 and the output signal of the NAND gate NAND is inputted to a D flip/flop (F/F) as an input signal. The rising edge signal CLK_R and the clock enable signal CKE are inputted in the first AND gate AND1 and an inverted output signal of the first AND gate AND1 is used a clock signal of the D F/F. The second AND gate AND 2 receives the output signal of the first AND gate AND1 and an output signal of the D F/F and outputs the rising edge clock signal RCLK.

Figure 4:
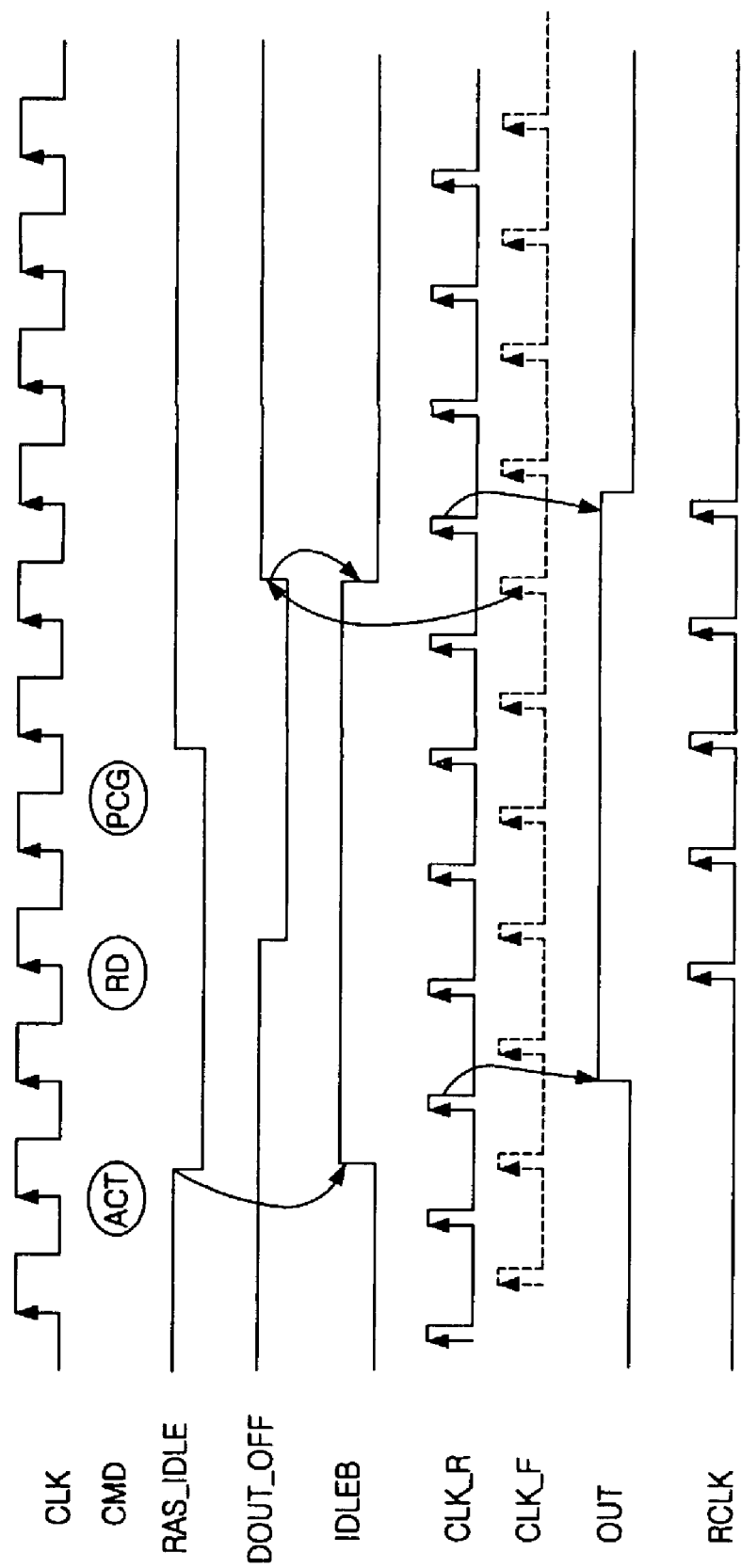
FIG. 4 is a timing diagram illustrating an operation of the rising clock signal generation circuit.

FIG. 4 is a timing diagram illustrating an operation of the rising clock signal generation circuit 210 in FIG. 3.

As shown, if the act and read commands for activating a wordline and a precharge command are successively inputted in the non power down mode, of which the clock enable signal CKE is a high state, the row address strobe idle signal RAS_IDLE becomes a low state in response to the act command and becomes a high state in response to the precharge command. The data out off signal DOUT_OFF becomes a low state in response to the read command and then becomes a high state after a predetermined data corresponding to a burst length is outputted. An idle bar signal IDLEB is generated by NANDing the row address strobe idle signal RAS_IDLE and the data out off signal DOUT_OFF.

The output signal OUT of the D F/F is generated in response to the rising edge clock signal CLK_R. When the rising edge clock signal CLK_R is a row state, the output signal OUT of the D F/F is enable to a high state. The rising edge clock signal outputted from the clock driver 200 is generated only when the output signal OUT of the D F/F is a high state.

Figure 5:
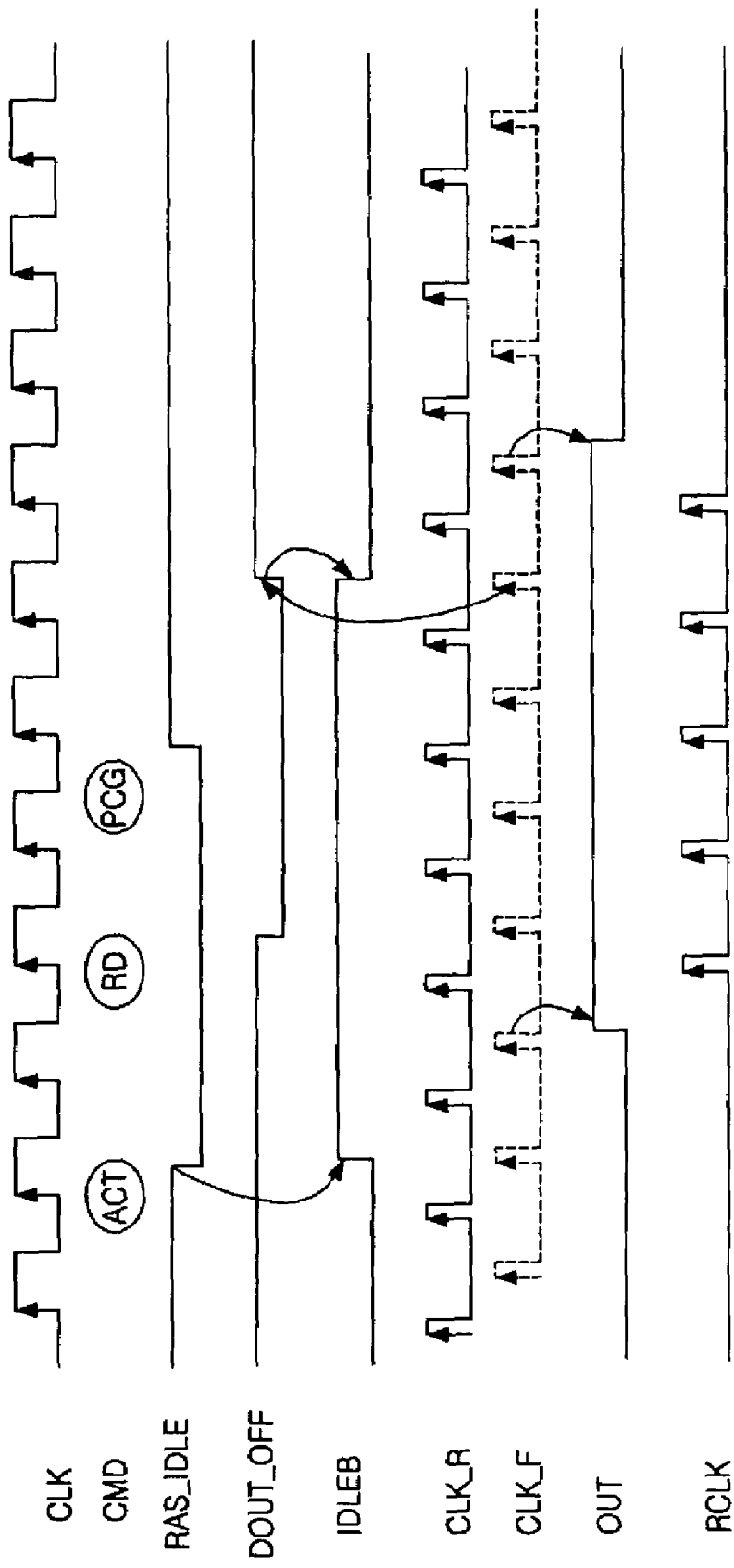
FIG. 5 is a timing diagram illustrating falling edge clock signal generation in the clock driver.

FIG. 5 is a timing diagram illustrating falling edge clock signal generation in the clock driver 200. The feature is similar to that of FIG. 4 except that the output of the D F/F controls the falling edge clock signal CLK_F.

Figure 6:
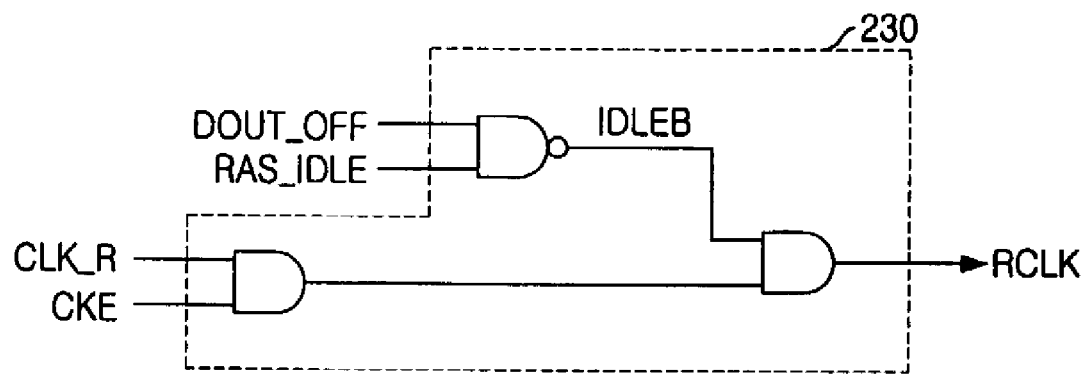
FIG. 6 is a circuit diagram illustrating a rising edge clock signal generation circuit in accordance with another embodiment of the present invention.

FIG. 6 is a circuit diagram illustrating a rising edge clock signal generation circuit in accordance with another embodiment of the present invention.

Even if glitch may be generated according to a period of the idle bar signal IDLEB and a rising edge clock signal CLK_R inputted into the clock driver 200, there is no problem that the circuit operates.

As mentioned above, there is an effect that a current consumption can be reduced in the stand-by mode, which is the power down mode, in accordance with the present invention.

While the present invention has been described with respect to the particular embodiments, it will be apparent to those skilled in the art that various changes and modifications may be made without departing from the spirit and scope of the invention as defined in the following claims.

What is claimed is:

1. A clock driver in a semiconductor memory device, in which a rising edge clock signal and a falling edge clock signal outputted from a DLL circuit are not transmitted to a data input/output control logic in a stand-by mode even though the rising edge clock signal and the falling edge clock signal are generated from the DLL circuit during a stand-by mode.

2. A clock driver in a semiconductor memory device, comprising:
   a NAND gate receiving a row address strobe idle signal, which becomes a first logic state when all wordlines are in a precharge mode, and a data out off signal, which becomes the first logic state when there is no data transmitted to a data output pin in a read operation;

a first AND gate receiving a rising edge clock signal outputted from a delay locked loop and a clock enable signal for enabling a clock signal;

an inverter for inverting an output signal of the first AND gate;

a D flip/flop receiving output signals of the NAND gate and the first inverter; and a second AND gate receiving output signals of the first AND gate and the D flip/flop.

3. A clock driver in a semiconductor memory device, comprising:

a NAND gate receiving a row address strobe idle signal, which becomes a first logic state when all wordlines are in a precharge mode, and a data out off signal, which becomes the first logic state when there is no data transmitted to a data output pin in a read operation;

a first AND gate receiving a rising edge clock signal outputted from a delay locked loop and a clock enable signal for enabling a clock signal; and a second AND gate receiving output signals of the NAND gate and the first AND gate.

4. The clock driver as recited in claim 1, wherein the stand-by mode is a state that there is no data transmitted through data input/output pins in a the non-power down mode.

5. A semiconductor memory device for reducing a current consumption in a stand-by mode, comprising:

a DLL circuit for compensating a delay generated due to internal circuits to thereby generate a rising edge clock signal and a falling edge clock signal;

a data input/output control block for transmitting a data based on the rising edge clock signal and the falling edge clock signal outputted from the DLL circuit; and a clock driver for receiving the rising edge clock signal and the falling edge clock signal outputted from the DLL circuit to thereby deliver the rising edge clock signal and the falling edge clock signal into the data input/output control block in response to an operation mode, wherein the clock driver does not transmit the rising edge clock signal and the falling edge clock signal to the data input/output control block in the stand-by mode.

6. The clock driver as recited in claim 5, wherein the stand-by mode is a state that there is no data transmitted through data input/output pins in a non-power down mode.

7. The semiconductor memory device as recited in claim 6, wherein the clock driver includes:

a NAND gate receiving a row address strobe idle signal, which becomes a first logic state when all wordlines are in a precharge mode, and a data out off signal, which becomes the first logic state when there is no data transmitted to a data output pin in a read operation;

a first AND gate receiving a rising edge clock signal outputted from a delay locked loop and a clock enable signal for enabling a clock signal;

an inverter for inverting an output signal of the first AND gate;

a D flip/flop receiving output signals of the NAND gate and the first inverter; and a second AND gate receiving output signals of the first AND gate and the D flip/flop.

8. The semiconductor memory device as recited in claim 6, wherein the clock driver includes:

a NAND gate receiving a row address strobe idle signal, which becomes a first logic state when all wordlines are in a precharge mode, and a data out off signal, which becomes the first logic state when there is no data transmitted to a data output pin in a read operation;

a first AND gate receiving a rising edge clock signal outputted from a delay locked loop and a clock enable signal for enabling a clock signal; and a second AND gate receiving output signals of the NAND gate and the first AND gate.

* * * * *